United States Patent
Krishnappa et al.

(10) Patent No.: US 9,846,612 B2
(45) Date of Patent: *Dec. 19, 2017

(54) SYSTEMS AND METHODS OF MEMORY BIT FLIP IDENTIFICATION FOR DEBUGGING AND POWER MANAGEMENT

(71) Applicant: QUALCOMM INCORPORATED, San Diego, CA (US)

(72) Inventors: Madan Krishnappa, San Diego, CA (US); Chinh Tran, San Diego, CA (US); Li Zhang, San Diego, CA (US); Alan Young, Carlsbad, CA (US); William Bainbridge, San Diego, CA (US); Bohuslav Rychlik, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 124 days.

This patent is subject to a terminal disclaimer.

(21) Appl. No.: 14/823,879

(22) Filed: Aug. 11, 2015

(65) Prior Publication Data
US 2017/0046219 A1    Feb. 16, 2017

(51) Int. Cl.
*G06F 11/10*  (2006.01)
*H03M 13/00*  (2006.01)
(Continued)

(52) U.S. Cl.
CPC ............ *G06F 11/10* (2013.01); *G06F 1/3206* (2013.01); *G06F 1/3296* (2013.01);
(Continued)

(58) Field of Classification Search
CPC ...... G06F 11/08; G06F 11/10; G06F 11/1008; G06F 11/30; G06F 11/3058;
(Continued)

(56) References Cited

U.S. PATENT DOCUMENTS 6,622,260 B1    9/2003    Marisetty et al.
7,444,490 B2    10/2008   Cases et al.
(Continued)

FOREIGN PATENT DOCUMENTS

CN    101976212 B    1/2012
CN    102867541 A    1/2013

OTHER PUBLICATIONS

Cho Y., et al., "System-Level Power Estimation using an On-Chip Bus Performance Monitoring Unit", IEEE Transactions on Computer-Aided Design of Integrated Circuits and Systems, Nov. 30, 2008 (Nov. 30, 2008), XP040462303, pp. 149-154. DOI: 10.1109/TCAD.2011.2160349.
(Continued)

*Primary Examiner* — Albert Decady
*Assistant Examiner* — Christian Dorman
(74) *Attorney, Agent, or Firm* — Smith Tempel Blaha LLC (57) ABSTRACT

Various embodiments of methods and systems for bit flip identification for debugging and/or power management in a system on a chip ("SoC") are disclosed. Exemplary embodiments seek to identify bit flip occurrences near in time to the occurrences by checking parity values of data blocks as the data blocks are written into a memory component. In this way, bit flips occurring in association with a write transaction may be differentiated from bit flips occurring in association with a read transaction. The distinction may be useful, when taken in conjunction with various parameter levels identified at the time of a bit flip recognition, to debug a memory component or, when in a runtime environment, adjust thermal and power policies that may be contributing to bit flip occurrences.

30 Claims, 8 Drawing Sheets

(51) Int. Cl.
*H03M 13/11* (2006.01)
*G06F 1/32* (2006.01)
*G06F 11/30* (2006.01)
*G11B 20/18* (2006.01)

(52) U.S. Cl.
CPC ......... *G06F 11/1008* (2013.01); *H03M 13/11* (2013.01); *H03M 13/611* (2013.01); *G06F 11/3058* (2013.01); *G06F 11/3062* (2013.01); *G11B 20/1816* (2013.01); *H03M 13/6505* (2013.01); *Y02B 60/1285* (2013.01)

(58) Field of Classification Search
CPC . G06F 11/3062; H03M 13/09; H03M 13/098; H03M 13/11; H03M 13/61; H03M 13/611; H03M 13/65; H03M 13/6502; H03M 13/6505; G11B 20/18; G11B 20/1816; G11B 20/1833
See application file for complete search history.

(56) References Cited

U.S. PATENT DOCUMENTS

| | | | |
|---|---|---|---|
| 7,631,228 B2 | 12/2009 | Brittain et al. | |
| 7,647,544 B1 * | 1/2010 | Masiewicz | G11B 20/1833 |
| | | | 360/53 |
| 8,352,781 B2 | 1/2013 | Garg et al. | |
| 8,429,436 B2 | 4/2013 | Fillingim et al. | |
| 8,769,376 B2 | 7/2014 | Khellah et al. | |
| 8,854,079 B2 | 10/2014 | Bartling et al. | |
| 8,910,021 B2 | 12/2014 | Shalvi et al. | |
| 9,331,714 B1 | 5/2016 | Yang et al. | |
| 2006/0280019 A1 | 12/2006 | Burton et al. | |
| 2010/0142291 A1 * | 6/2010 | Joo | G06F 1/206 |
| | | | 365/189.15 |
| 2010/0325345 A1 | 12/2010 | Ohno et al. | |
| 2011/0119456 A1 | 5/2011 | Ipek et al. | |
| 2013/0138993 A1 | 5/2013 | Franklin | |
| 2014/0047301 A1 | 2/2014 | Kurata | |
| 2014/0192583 A1 | 7/2014 | Rajan et al. | |
| 2014/0281311 A1 | 9/2014 | Walker et al. | |
| 2014/0372816 A1 | 12/2014 | Bains et al. | |
| 2015/0301933 A1 * | 10/2015 | Tuers | G06F 12/0246 |
| | | | 714/773 |
| 2017/0046218 A1 | 2/2017 | Krishnappa et al. | |

OTHER PUBLICATIONS

International Search Report and Written Opinion—PCT/US2016/042459—ISA/EPO—dated Nov. 4, 2016.

* cited by examiner

SYSTEMS AND METHODS OF MEMORY BIT FLIP IDENTIFICATION FOR DEBUGGING AND POWER MANAGEMENT

DESCRIPTION OF THE RELATED ART

Portable computing devices ("PCDs") are becoming necessities for people on personal and professional levels. These devices may include cellular telephones, portable digital assistants ("PDAs"), portable game consoles, palmtop computers, and other portable electronic devices. PCDs commonly contain integrated circuits, or systems on a chip ("SoC"), that include numerous components designed to work together to deliver functionality to a user. For example, a SoC may contain any number of master components such as modems, displays, central processing units ("CPUs"), graphical processing units ("GPUs"), etc. that read and/or write data and/or instructions to and/or from memory components on the SoC.

As one of ordinary skill in the art would understand, maintaining integrity of data and instructions stored in a memory device is crucial for consistent and reliable delivery of functionality to a PCD user. The integrity of data may be compromised due to any number of factors including, but not necessarily limited to, low power conditions, bus transmission errors, thermal energy exposure, etc. Such factors may cause one or more of the bits that form the data string to be "flipped" from one state to another, thereby compromising the integrity of the entire data string that includes the flipped bit(s).

To verify the integrity of a given string of data (e.g., an 8-bit byte of data), traditional parity checking methodologies compute a parity value when a string of data is written into a memory device array. The parity value is saved in the array in a parity bit along with the data. The parity value is determined from the sum of the binary values in the data. Later, when the data is read out of the memory array, the parity value is recalculated and compared to the value stored in the parity bit. If the recalculated value differs from the stored value, the data string may have been compromised due to one or more "bit flips" having occurred sometime prior to the read transaction.

Traditional parity checking methodologies known in the art are effective at determining whether a parity error has occurred. Notably, however, traditional parity checking methodologies are incapable of determining when or where a parity error occurred. That is, traditional parity checking methodologies have no way of identifying whether the bit(s) flipped on the write transaction, while stored in the memory array, or on the read transaction. Moreover, traditional parity checking methodologies have no way of determining when a bit may have flipped and, as such, offer little insight to designers seeking to identify conditions on the SoC that may have caused the bits to flip.

Therefore, there is a need in the art for a system and method that enables a designer to identify when and where a parity error occurred so that the rate of future parity error occurrences may be efficiently mitigated. More specifically, there is a need in the art for a memory bit flip debugging system and method. Further, there is a need in the art for a power management system and methodology that considers a bit flip rate so that future bit flip occurrences may be mitigated or avoided.

SUMMARY OF THE DISCLOSURE

Various embodiments of methods and systems for bit flip identification for debugging and/or power management in a system on a chip ("SoC") are disclosed. In a first exemplary embodiment, a method for debugging a memory component in a SoC includes monitoring one or more parameters of the SoC that are associated with bit flips in a memory component. Notably, the parameters are monitored so that, when bit flips are identified, the values of the parameters at the time of the bit flip occurrence may be used to "debug" the memory component. The exemplary method calculates a baseline parity value for a data block of bits queued to be written to a bit cell array of the memory component. The baseline parity value is assigned to a parity bit concatenated with the data block. Next, the data block is simultaneously written to both the bit cell array and a buffer of the memory component. From the instantiation of the data block in the buffer portion of the memory component, a write-side parity value is calculated and compared to the baseline parity value. If the baseline parity value differs from the write-side parity value, it may be determined that one or more bits of the data block has experienced a bit flip while being written to the memory component. At such time, the values of the monitored parameters may be useful in debugging the memory component and, so, the exemplary method determines the levels of the one or more parameters that were being monitored. At the same time, a system halt or write parity error output may be generated to provide for determining which of the one or more parameters caused the one or more bits of the first data block to experience a bit flip.

Continuing with the first exemplary embodiment, if the baseline parity value is the same as the write-side parity value, the data block may be determined to have good integrity, i.e. not corrupted, and stored in the bit cell array until it is read out in a read transaction. Subsequently, when the data block is read out, a read-side parity value may be calculated and compared to the baseline parity. If the baseline parity value differs from the read-side parity value, the exemplary method may deduce that one or more bits of the data block has experienced a bit flip while being read from the memory component. At such time, the values of the monitored parameters may be useful in debugging the memory component and, so, the exemplary method determines the levels of the one or more parameters that were being monitored. At the same time, a system halt or read parity error output may be generated to provide for determining which of the one or more parameters caused the one or more bits of the first data block to experience a bit flip.

In a second exemplary embodiment, a method for debugging a memory component in a SoC includes monitoring one or more parameters of the SoC that are associated with bit flips in a memory component. Notably, the parameters are monitored so that, when bit flips are identified, the values of the parameters at the time of the bit flip occurrence may be used to "debug" the memory component. The exemplary method calculates a first baseline parity value for a first data block of bits queued to be written to a first bit cell array of the memory component. The first baseline parity value is assigned to a parity bit concatenated or associated with the first data block. Next, the first data block (which includes the parity bit) is written to the first bit cell array. From the instantiation of the first data block in the first bit cell array, and before the first data block is read out from the bit cell array, a first write-side parity value is calculated and compared to the first baseline parity value. If the first baseline parity value differs from the first write-side parity value, it may be determined that one or more bits of the first data block has experienced a bit flip while being written to the memory component. At such time, the values of the monitored parameters may be useful in debugging the memory component and, so, the exemplary method determines the levels of the one or more parameters that were being monitored. At the same time, a system halt or write parity error output may be generated to provide for determining which of the one or more parameters caused the one or more bits of the first data block to experience a bit flip.

Continuing with the second exemplary embodiment, if the baseline parity value is the same as the write-side parity value, the data block may be determined to have good integrity, i.e. not corrupted, and stored in the bit cell array until it is read out in a read transaction. Subsequently, when the data block is read out, a read-side parity value may be calculated and compared to the baseline parity. If the baseline parity value differs from the read-side parity value, the exemplary method may deduce that one or more bits of the data block has experienced a bit flip while being read from the memory component. At such time, the values of the monitored parameters may be useful in debugging the memory component and, so, the exemplary method determines the levels of the one or more parameters that were being monitored. At the same time, a system halt or read parity error output may be generated to provide for determining which of the one or more parameters caused the one or more bits of the first data block to experience a bit flip.

In a third exemplary embodiment, a method for power management in a system on a chip ("SoC") includes monitoring one or more parameters of the SoC that are associated with bit flips. Notably, the parameters are monitored so that, when bit flips are identified, the values of the parameters may be used to determine adjustments to a thermal and power management policy in order to combat and/or mitigate future bit flip occurrences. The exemplary method calculates baseline parity values for data blocks of bits queued to be written to bit cell arrays of the memory component and assigns the baseline parity values to parity bits uniquely associated with the data blocks. The data blocks are written to the bit cell arrays and a buffer of the memory component and, for each data block as it is written to the buffer, a write-side parity value is calculated. For each data block, its baseline parity value is compared to its write-side parity value and, if the baseline parity value differs from the write-side parity value, the occurrence of a bit flip is recorded or otherwise noted. The bit flip occurrences may be recorded in a register or a memory component, as would be understood by one of ordinary skill in the art. Based on determining that a rate of bit flip occurrences has exceeded a threshold, the exemplary embodiment causes an adjustment to a thermal and power management policy associated with one or more component of the SoC. Notably, if/when the bit flip occurrence rate subsides below the threshold, the exemplary embodiment may cause a readjustment to the thermal and power management policy.

In a fourth exemplary embodiment, a method for power management in a system on a chip ("SoC") includes monitoring one or more parameters of the SoC that are associated with bit flips. Notably, the parameters are monitored so that, when bit flips are identified, the values of the parameters may be used to determine adjustments to a thermal and power management policy in order to combat and/or mitigate future bit flip occurrences. The exemplary method calculates baseline parity values for data blocks of bits queued to be written to bit cell arrays of the memory component and assigns the baseline parity values to parity bits uniquely associated with the data blocks. The data blocks are written to the bit cell arrays and, for each data block as it is written to its bit cell array, a write-side parity value is calculated. For each data block, its baseline parity value is compared to its write-side parity value and, if the baseline parity value differs from the write-side parity value, the occurrence of a bit flip is recorded or otherwise noted. The bit flip occurrences may be recorded in a register or a memory component, as would be understood by one of ordinary skill in the art. Based on determining that a rate of bit flip occurrences has exceeded a threshold, the exemplary embodiment causes an adjustment to a thermal and power management policy associated with one or more component of the SoC. Notably, if/when the bit flip occurrence rate subsides below the threshold, the exemplary embodiment may cause a readjustment to the thermal and power management policy.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure or figures. Letter character designations for reference numerals may be omitted when it is intended that a reference numeral to encompass all parts having the same reference numeral in all figures.

DETAILED DESCRIPTION

The word "exemplary" is used herein to mean serving as an example, instance, or illustration. Any aspect described herein as "exemplary" is not necessarily to be construed as exclusive, preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

In this description, the terms "data," "data bits," "data string" and "data block" are used interchangeably unless otherwise indicated. For ease of description of the exemplary embodiments, a data string may be envisioned as an 8-bit byte of binary code plus a check bit. It will be understood, however, that the solution described herein is not limited to use in connection with 8-bit data strings, as would be evident to one of ordinary skill in the art reading this specification.

In this description, reference to double data rate ("DDR") memory and/or static random access memory ("SRAM") components will be understood to envision any of a broader class of volatile random access memory ("RAM") used for long term data storage and will not limit the scope of the solutions disclosed herein to a specific type or generation of RAM.

As used in this description, the terms "component," "database," "module," "system," "controller," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "central processing unit ("CPU")," "digital signal processor ("DSP")," "graphical processing unit ("GPU")," and "chip" are essentially used interchangeably. Moreover, a CPU, DSP, GPU or a chip may be comprised of one or more distinct processing components generally referred to herein as "core(s)."

In this description, the terms "engine," "processing engine," "master processing engine," "master component" and the like are used to refer to any component within a system on a chip ("SoC") that generates transaction requests to a memory subsystem via a bus. As such, a master component may refer to, but is not limited to refer to, a CPU, DSP, GPU, modem, controller, display, camera, etc.

In this description, the term "bus" refers to a collection of wires through which data is transmitted from a processing engine to a memory component or other device located on or off the SoC. It will be understood that a bus consists of two parts—an address bus and a data bus where the data bus transfers actual data and the address bus transfers information specifying location of the data in a memory component. The term "width" or "bus width" or "bandwidth" refers to an amount of data, i.e. a "chunk size," that may be transmitted per cycle through a given bus. For example, a 16-byte bus may transmit 16 bytes of data at a time, whereas 32-byte bus may transmit 32 bytes of data per cycle. Moreover, "bus speed" refers to the number of times a chunk of data may be transmitted through a given bus each second. Similarly, a "bus cycle" or "cycle" refers to transmission of one chunk of data through a given bus.

In this description, the term "portable computing device" ("PCD") is used to describe any device operating on a limited capacity power supply, such as a battery. Although battery operated PCDs have been in use for decades, technological advances in rechargeable batteries coupled with the advent of third generation ("3G") and fourth generation ("4G") wireless technology have enabled numerous PCDs with multiple capabilities. Therefore, a PCD may be a cellular telephone, a satellite telephone, a pager, a PDA, a smartphone, a navigation device, a smartbook or reader, a media player, a combination of the aforementioned devices, a laptop computer with a wireless connection, among others.

One way to verify the integrity of a data string is to use a parity checking methodology. If a particular string is found to include an error, it is flagged as corrupted data and a parity error output is generated. Error detection schemes based on parity use a parity bit, or check bit, that is concatenated or added to the end of a string of binary code. The parity bit indicates whether the number of bits in the data string with the value one is even or odd, as would be understood by one of ordinary skill in the art. As such, the term "parity" in this description refers to the evenness or oddness of the number of bits with value "one" within a given set of bits that form a data string, and is thus determined by the value of all the bits. Parity can be calculated via an XOR sum of the bits, as would be understood by one of ordinary skill in the art, yielding "0" for even parity and "1" for odd parity, as the case may be. This property of being dependent upon all the bits and changing value if any one bit is flipped allows for a memory bit flip identification ("BFI") embodiment to use parity to recognize when and where an error has occurred, thereby improving the efficiency and accuracy of debugging memory components, correcting error causing conditions in the SoC, and/or optimizing management of power across components in a SoC.

Notably, although exemplary embodiments of a BFI solution are described herein within the context of a typical SRAM type storage device, it is envisioned that certain embodiments of the solution may be applied in conjunction with a memory device that employs error-correcting code ("ECC"). As one of ordinary skill in the art of ECC memory devices would recognize, an ECC memory device may be capable of not only detecting an error in a data string, but also correcting the error so that the SoC may continue in its operation without interruption and without corrupting further data. Notably, however, even though ECC memory devices may be able to detect and correct memory bit flips, error-correcting code known in the art is not capable of identifying the reason, time or location of the bit flip event. Consequently, embodiments of a BFI solution may leverage the redundant instantiation of a data string in an ECC memory device for recognizing a parity error at an opportune time for identifying real-time conditions under which the parity error may have occurred.

In general, a BFI solution may include a memory component configured to support an additional "debug mode input." When the debug mode input is asserted, an additional parity check logic may be enabled that causes data being written to a given bit cell array in the memory device to also be written into a buffer simultaneously. Notably, the buffer serves as a mirrored clone of the bit cell array of memory, sharing the same PDN and clock with other bit cell arrays. In this way, the data in the buffer and the data in a given bit cell array have a high correlation with one another when encountering abnormal conditions such as, but not limited to, power net overshoot/undershoot, ground bounce, and clock ditches. As such, if bit flipping occurs at a "regular" bit cell array due to any abnormal transient conditions, the buffer is highly likely to experience the same bit flipping phenomenon. Advantageously, the broadcasting of write to any of memory bit arrays and to the buffer may be enabled for a debug mode.

The write data written into the buffer may be subjected to a standard parity generation algorithm, the result of which may be compared to a previously generated parity code associated with the write data and input to the memory device during the write transaction. A mismatch of the parity values may generate a write parity error output that halts the system. In this way, a BFI solution may isolate corrupted code that results from a bit flip during a write transaction, thereby setting the stage for real-time identification of conditions on the system that could have caused the unwanted bit flip.

Notably, as write data is checked and cleared through the buffer, data from subsequent write transactions may be overwritten into the buffer. In this way, the write data may stay instantiated in the memory indefinitely until read out and/or updated while the same write data is checked for parity in real time, or near real time, relative to the write transaction. Advantageously, BFI embodiments may be able to differentiate between parity errors associated with a write transaction versus parity errors associated with a read transaction. Reporting a write transaction parity error near to the time in which the write parity error occurred enables a BFI embodiment to stop a processor operation and preserve its state for effective analysis and debugging. Moreover, a BFI embodiment may be able to timely respond to error occurrences, and prevent or mitigate future occurrences, by coordinating with a power management and/or thermal policy manager to increase power to the memory component and/or reduce thermal energy generation from a thermally aggressive component collocated on the SoC with the memory component or otherwise near the memory component.

Figure 1:
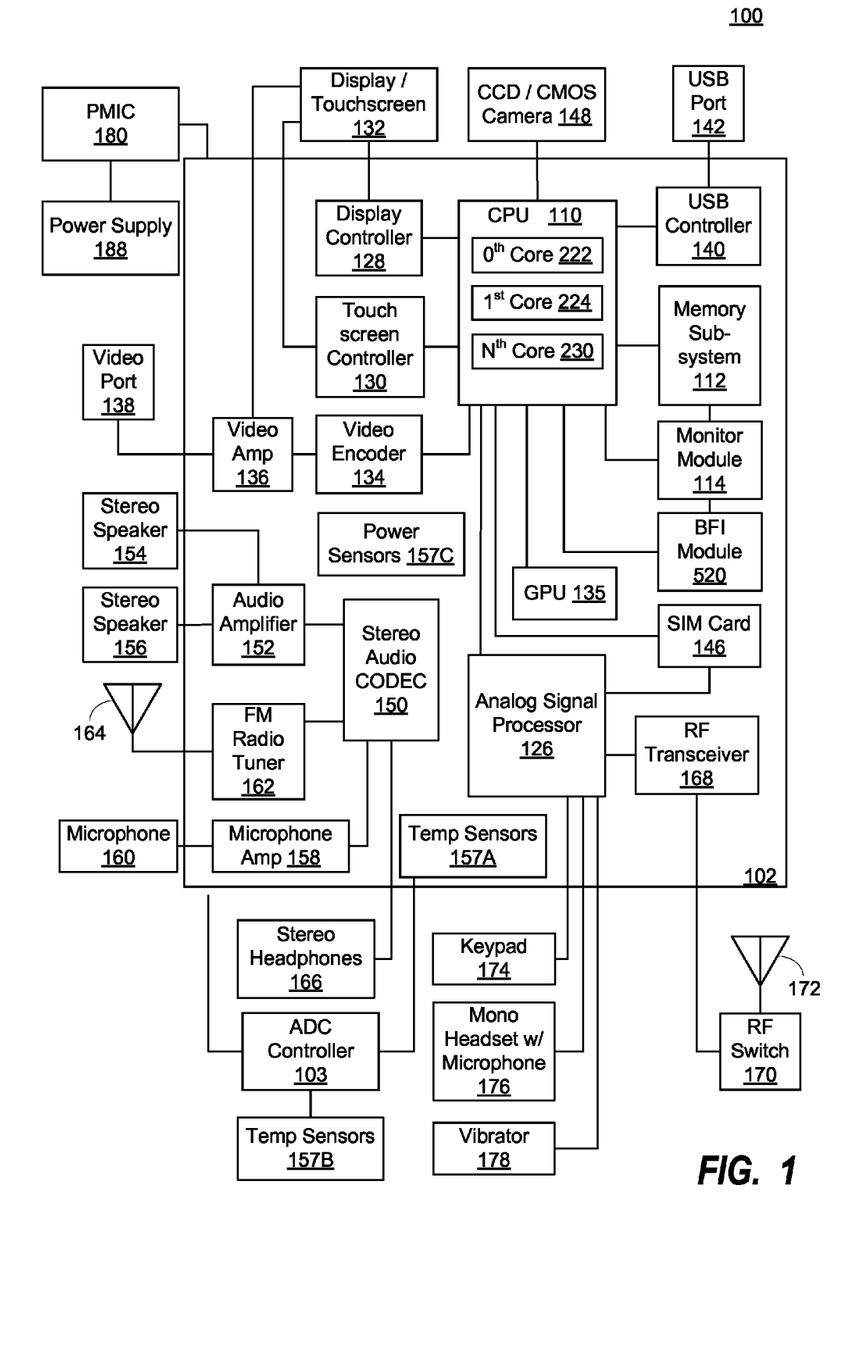
FIG. 1 is a functional block diagram illustrating an exemplary, non-limiting aspect of a portable computing device ("PCD") in the form of a wireless telephone for implementing memory bit flip identification ("BFI") systems and methods.

FIG. 1 is a functional block diagram illustrating an exemplary, non-limiting aspect of a portable computing device ("PCD") 100 in the form of a wireless telephone for implementing memory bit flip identification ("BFI") systems and methods. As shown, the PCD 100 includes an on-chip system 102 that includes a multi-core central processing unit ("CPU") 110 and an analog signal processor 126 that are coupled together. The CPU 110 may comprise a zeroth core 222, a first core 224, and an Nth core 230 as understood by one of ordinary skill in the art. Further, instead of a CPU 110, a digital signal processor ("DSP") may also be employed as understood by one of ordinary skill in the art.

In general, the portion of the system 102 for implementing a BFI solution comprises, inter alia, a memory subsystem 112 (comprises a memory storage device such as an SRAM device 113, a write-side parity generation hardware module 515, and a read-side parity generation and comparison hardware module 515), a monitor module 114, and a BFI module 520 (comprises a BFD parity generation and comparison hardware module). The memory subsystem 112 and the BFI module 520 in general, and some of their components specifically, may be formed from hardware and/or firmware and may be responsible for detecting bit flips and identifying conditions associated with the bit flip event.

The run-time variables associated with busses, power supplies, thermally aggressive processing components and the like may be monitored by the monitor module 114 and documented in association with the real-time, or near real-time, recognition of a bit flip by BFI module 520. Advantageously, by checking parity of data strings in near real time as the data strings are written into memory 112, embodiments of a BFI solution may be able to identify the conditions on the SoC under which the bit flip occurred. With knowledge of those conditions, designers may be able to more quickly and efficiently debug the SoC 102 and make design changes that will mitigate or eliminate future bit flips in a given data string. Additionally, during runtime, adjustments may be made to operating conditions on the SoC 102 to mitigate or eliminate future bit flips in a memory component 112.

As illustrated in FIG. 1, a display controller 128 and a touch screen controller 130 are coupled to the digital signal processor 110. A touch screen display 132 external to the on-chip system 102 is coupled to the display controller 128 and the touch screen controller 130. PCD 100 may further include a video encoder 134, e.g., a phase-alternating line ("PAL") encoder, a sequential couleur avec memoire ("SECAM") encoder, a national television system(s) committee ("NTSC") encoder or any other type of video encoder 134. The video encoder 134 is coupled to the multi-core CPU 110. A video amplifier 136 is coupled to the video encoder 134 and the touch screen display 132. A video port 138 is coupled to the video amplifier 136.

As depicted in FIG. 1, a universal serial bus ("USB") controller 140 is coupled to the CPU 110. Also, a USB port 142 is coupled to the USB controller 140. The memory subsystem 112, which may include a PoP memory, a mask ROM/Boot ROM, a boot OTP memory, a DDR memory, SRAM memory 113 and buffer (see subsequent Figures) may also be coupled to the CPU 110 and/or include its own dedicated processor(s). A subscriber identity module ("SIM") card 146 may also be coupled to the CPU 110. Further, as shown in FIG. 1, a digital camera 148 may be coupled to the CPU 110. In an exemplary aspect, the digital camera 148 is a charge-coupled device ("CCD") camera or a complementary metal-oxide semiconductor ("CMOS") camera.

As further illustrated in FIG. 1, a stereo audio CODEC 150 may be coupled to the analog signal processor 126. Moreover, an audio amplifier 152 may be coupled to the stereo audio CODEC 150. In an exemplary aspect, a first stereo speaker 154 and a second stereo speaker 156 are coupled to the audio amplifier 152. FIG. 1 shows that a microphone amplifier 158 may be also coupled to the stereo audio CODEC 150. Additionally, a microphone 160 may be coupled to the microphone amplifier 158. In a particular aspect, a frequency modulation ("FM") radio tuner 162 may be coupled to the stereo audio CODEC 150. Also, an FM antenna 164 is coupled to the FM radio tuner 162. Further, stereo headphones 166 may be coupled to the stereo audio CODEC 150.

FIG. 1 further indicates that a radio frequency ("RF") transceiver 168 may be coupled to the analog signal processor 126. An RF switch 170 may be coupled to the RF transceiver 168 and an RF antenna 172. As shown in FIG. 1, a keypad 174 may be coupled to the analog signal processor 126. Also, a mono headset with a microphone 176 may be coupled to the analog signal processor 126. Further, a vibrator device 178 may be coupled to the analog signal processor 126. FIG. 1 also shows that a power supply 188, for example a battery, is coupled to the on-chip system 102 through a power management integrated circuit ("PMIC") 180. In a particular aspect, the power supply 188 includes a rechargeable DC battery or a DC power supply that is derived from an alternating current ("AC") to DC transformer that is connected to an AC power source.

The CPU 110 may also be coupled to one or more internal, on-chip thermal sensors 157A as well as one or more external, off-chip thermal sensors 157B. The on-chip system 102 may also include one or more power sensors 157C for monitoring power levels associated with memory 112, busses, thermally aggressive processing components (e.g., a core of CPU 110, GPU 135, etc.) and the like. The on-chip thermal sensors 157A may comprise one or more proportional to absolute temperature ("PTAT") temperature sensors that are based on vertical PNP structure and are usually dedicated to complementary metal oxide semiconductor ("CMOS") very large-scale integration ("VLSI") circuits. The off-chip thermal sensors 157B may comprise one or more thermistors. The thermal and power sensors 157 may produce a voltage drop that is converted to digital signals with an analog-to-digital converter ("ADC") controller (not shown). However, other types of thermal and/or power sensors 157 may be employed.

The touch screen display 132, the video port 138, the USB port 142, the camera 148, the first stereo speaker 154, the second stereo speaker 156, the microphone 160, the FM antenna 164, the stereo headphones 166, the RF switch 170, the RF antenna 172, the keypad 174, the mono headset 176, the vibrator 178, thermal sensors 157B, the PMIC 180 and the power supply 188 are external to the on-chip system 102. It will be understood, however, that one or more of these devices depicted as external to the on-chip system 102 in the exemplary embodiment of a PCD 100 in FIG. 1 may reside on chip 102 in other exemplary embodiments.

In a particular aspect, one or more of the method steps described herein may be implemented by executable instructions and parameters stored in the memory subsystem 112. Further, the BFD module 520, parity generation modules 515, 516, and monitor module 114, the logic stored therein, or a combination thereof may serve as a means for performing one or more of the method steps described herein.

Figure 2:
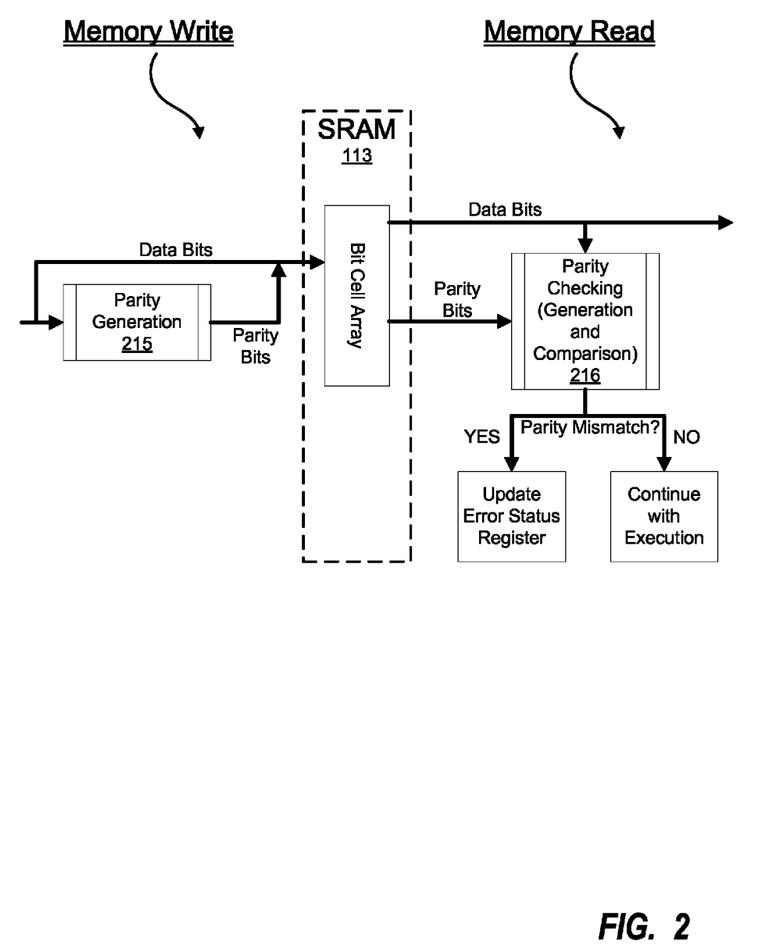
FIG. 2 is a functional block diagram illustrating a traditional parity check methodology.

FIG. 2 is a functional block diagram illustrating a traditional parity check methodology. Reviewing the FIG. 2 diagram from left to right, a write transaction of data bits may be transmitted toward a memory device such as SRAM 113. A parity bit may be generated from the data bits using parity generation module 215. The parity bit may be provided to the SRAM 113 and stored in a bit cell array in association with the data bits. When the data bits are eventually read out of the SRAM 113 a parity checking module 216 may regenerate a parity value and compare it to the original value generated by the module 215 and stored in the parity bit. If the parity value generated by downstream, memory read-side module 216 does not match the parity value generated by upstream, memory write-side module 215, a parity mismatch is identified and the error status register is updated accordingly. Of course, if the upstream and downstream parity values are a match, then the data bits are deemed uncorrupted and the execution is allowed to continue.

Notably, because any parity error in the data bits is only identified when the data bits are eventually read out of SRAM 113 (i.e., on the Memory Read), the methodology illustrated in FIG. 2 provides no insight into when, where or why the bit flips may have occurred. That is, the FIG. 2 methodology can determine that the data bits have been compromised, but cannot identify whether the bit flips occurred on the Memory Write side of the transaction, while in memory or during the Memory Read. Moreover, the FIG. 2 methodology provides no useful timing for identifying the state of conditions on the SoC that may have caused the bit flip(s) that corrupted the data and, as such, offers little value as input to a power and thermal management policy.

Figure 3:
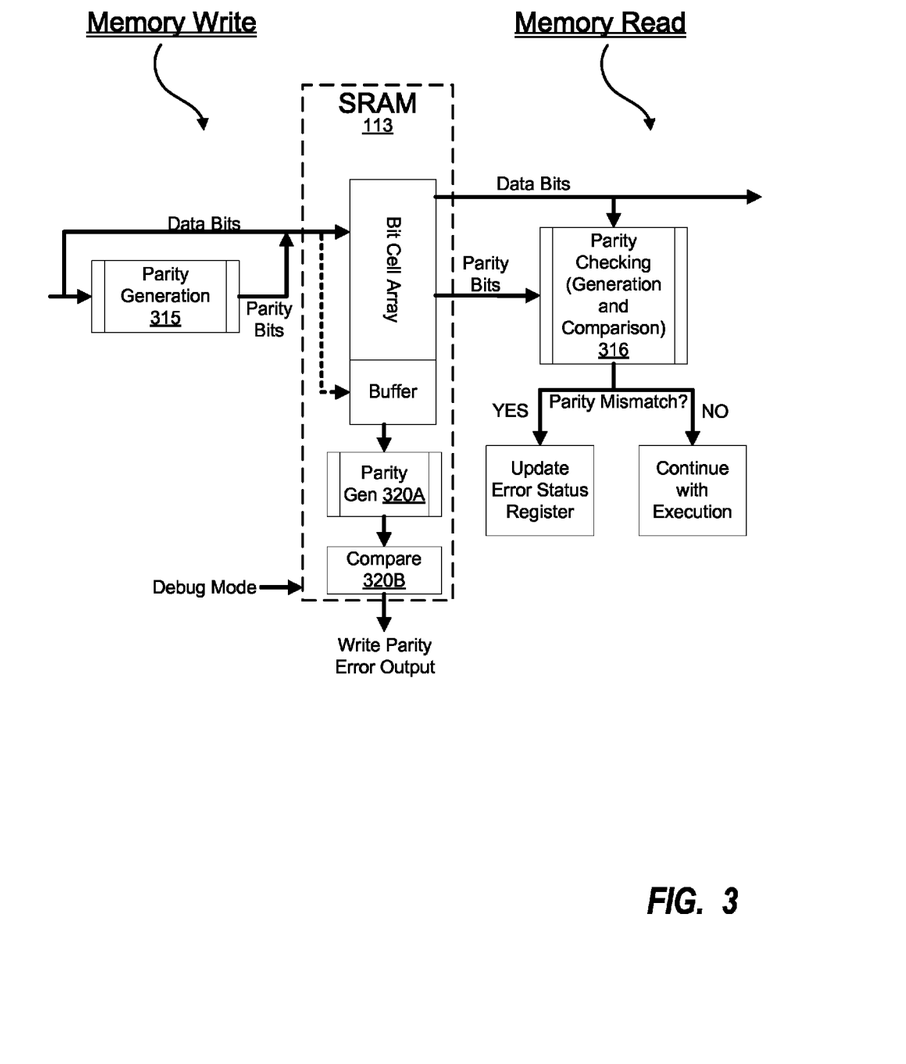
FIG. 3 is a functional block diagram illustrating an exemplary memory bit flip identification ("BFI") methodology using a buffer.

FIG. 3 is a functional block diagram illustrating an exemplary memory bit flip identification ("BFI") methodology using a buffer. Similar to that which was described above relative to the FIG. 2 illustration, a parity generation module 315 generates a baseline parity value based on the data bits being written to SRAM 113. The baseline parity value is stored in a parity bit in association with the data bits in a bit cell array. In the BFI embodiment of FIG. 3, however, the data bits are simultaneously written into a buffer and the baseline parity bit value is provided to a BFI module 320 (not explicitly depicted in the FIG. 3 illustration, but comprising the functionality of parity generator 320A and comparison module 320B).

Figure 5A:
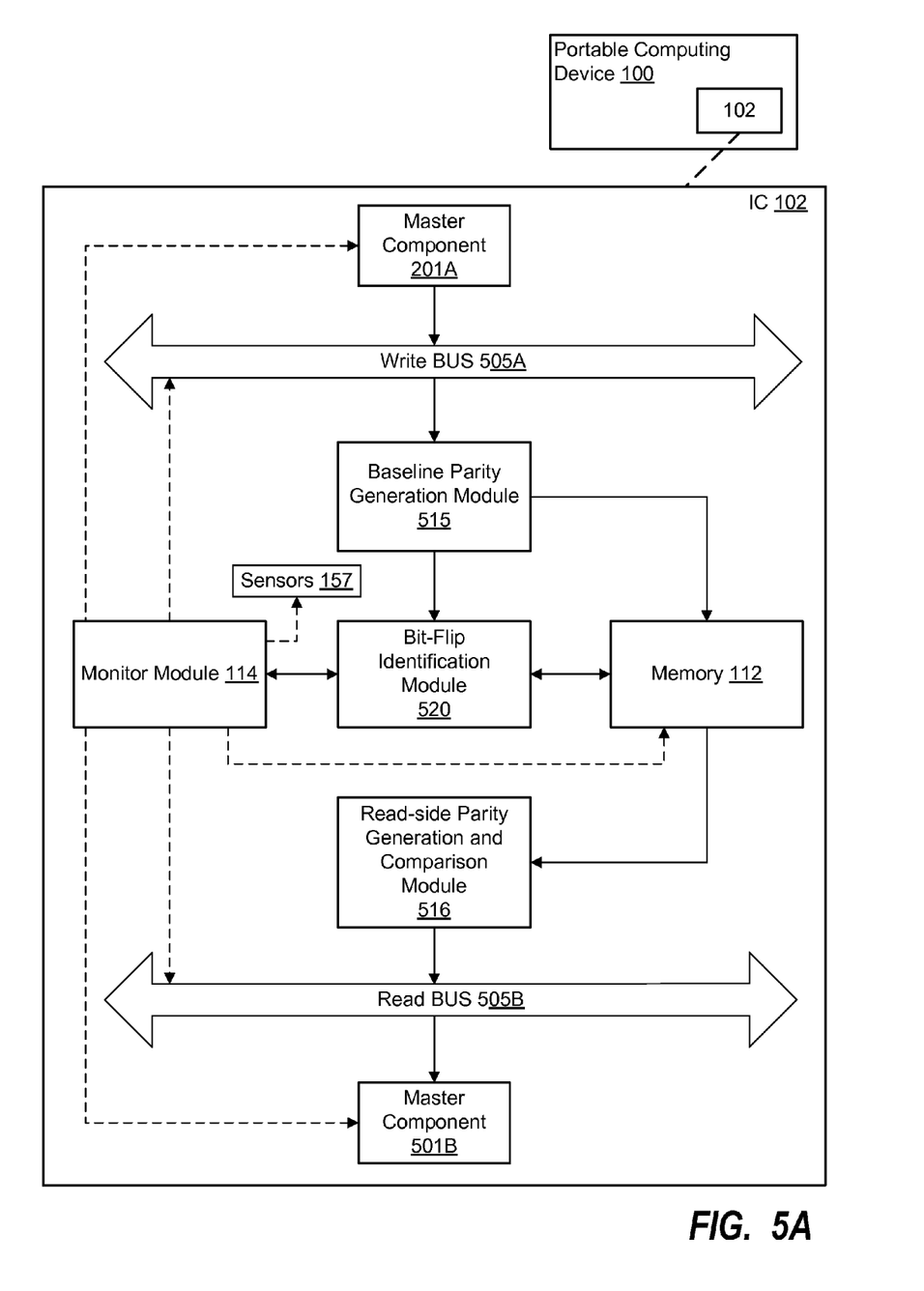
FIG. 5A is a functional block diagram illustrating an exemplary embodiment of an on-chip system for memory bit flip identification ("BFI") and debugging solutions.
Figure 5B:
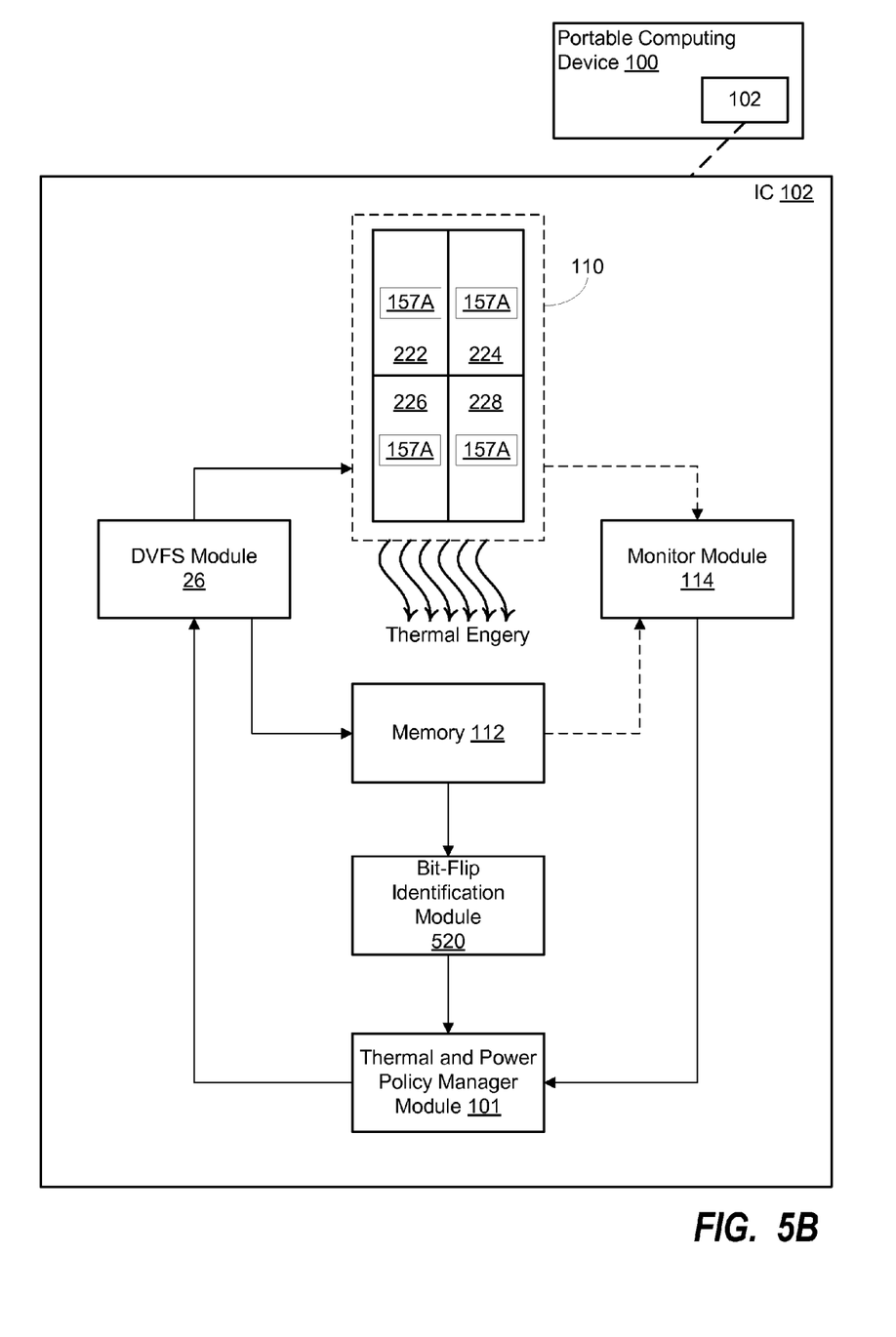
FIG. 5B is a functional block diagram illustrating an exemplary embodiment of an on-chip system for memory bit flip identification ("BFI") and power management solutions.

With a debug mode input active, the BFI module 320 may generate a write-side parity value from the data bits as they are instantiated in the buffer. Subsequently, the baseline parity bit value may be compared 320B with the write-side parity value to determine if a bit flip has occurred during the Memory Write transaction. If a bit flip is identified via the comparison at 320B, a parity output error may be generated and used to trigger a halt to the entire system (for debugging purposes). Alternatively, during runtime, if a bit flip is identified via the comparison at 320B, an input to a thermal and power policy manager may be generated (for optimizing power supply levels). As will be explained more thoroughly relative to FIG. 5 below, the output error may also be used to trigger identification of various conditions or parameters monitored around the chip that may have caused the unwanted bit flip. Knowledge of the various conditions or parameters associated with the bit flip may be useful for debugging efforts during a design stage or power management during a runtime environment.

Advantageously, because a bit flip associated with the memory write may be identified by the BFI module 320 working from the data instantiated in the buffer, any parity mismatch identified on the memory read of the data from the SRAM 113 may be attributed to conditions associated with the time during which the data existed in the bit cell array or with the memory read transaction itself. As the data bits are eventually read out of the SRAM 113, a parity checking module 316 may generate a read-side parity value and compare it to the baseline value stored in the parity bit. If the baseline parity value matches the read-side parity value, then execution of the chip may continue. Otherwise, a mismatch in the baseline parity value and the read-side parity value indicates that the data was corrupted at some time and for some reason subsequent to the write-side parity value generation and comparison at 320B.

Figure 4:
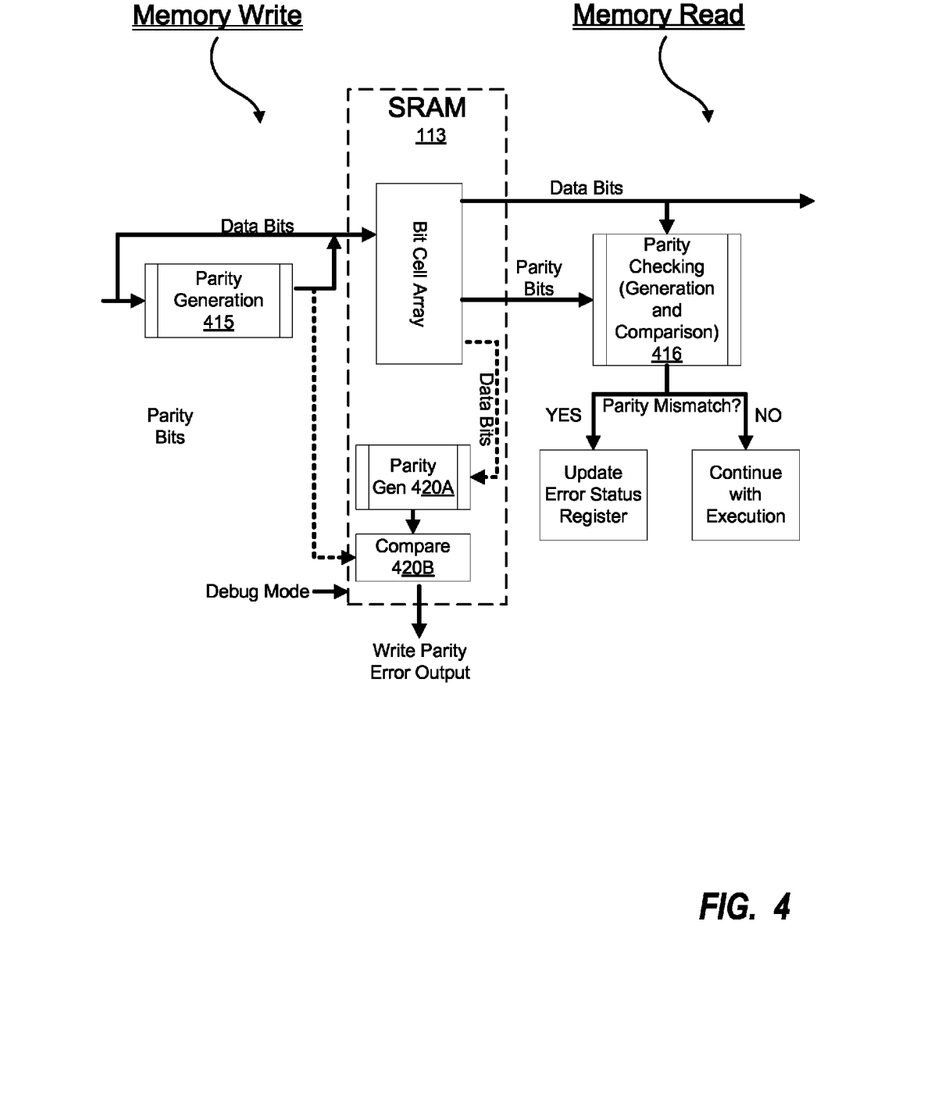
FIG. 4 is a functional block diagram illustrating an exemplary memory bit flip identification ("BFI") methodology without the buffer leveraged in the FIG. 3 embodiment.

FIG. 4 is a functional block diagram illustrating an exemplary memory bit flip identification ("BFI") methodology without the buffer leveraged in the FIG. 3 embodiment. Similar to that which was described above relative to the FIG. 2 illustration, a parity generation module 415 generates a baseline parity value based on the data bits being written to SRAM 113. The baseline parity value is stored in a parity bit in association with the data bits in a bit cell array. In the BFI embodiment of FIG. 4, however, the baseline parity bit value is provided to a BFI module 420 (not explicitly depicted in the FIG. 3 illustration, but comprising the functionality of parity generator 420A and comparison module 420B).

With a debug mode input active, the BFI module 420 may generate a write-side parity value from the data bits as they are instantiated in the bit cell array. Notably, this FIG. 4 embodiment may be applicable within the context of a ECC memory device, as an ECC memory device is configured for redundant writes of data similar to that which was described relative to the buffer in the FIG. 3 illustration. Subsequently, the baseline parity bit value may be compared 420B with the write-side parity value to determine if a bit flip has occurred during the Memory Write transaction. If a bit flip is identified via the comparison at 420B, a parity output error may be generated and used to trigger a halt to the entire system or trigger a modification of a thermal/power management scheme. As will be explained more thoroughly relative to FIG. 5 below, the output error may also be used to trigger identification of various conditions or parameters monitored around the chip that may have caused the unwanted bit flip.

Advantageously, because a bit flip associated with the memory write may be identified by the BFI module 420 working from the data instantiated in the bit cell array, any parity mismatch identified on the memory read of the data from the SRAM 113 may be attributed to conditions associated with the time during which the data existed in the bit cell array or with the memory read transaction itself. As the data bits are eventually read out of the SRAM 113, a parity checking module 416 may generate a read-side parity value and compare it to the baseline value stored in the parity bit. If the baseline parity value matches the read-side parity value, then execution of the chip may continue. Otherwise, a mismatch in the baseline parity value and the read-side parity value indicates that the data was corrupted at some time and for some reason subsequent to the write-side parity value generation and comparison at 420B.

FIG. 5A is a functional block diagram illustrating an exemplary embodiment of an on-chip system for memory bit flip identification ("BFI") and debugging solutions. As can be seen in the FIG. 5A illustration, a master component 501A may write data to memory 112 via write bus 505A, as would be understood by one of ordinary skill in the art. A baseline parity generation module 515 may generate a baseline parity bit value and provide it to the memory 112 along with the data bits from which it generated the baseline parity bit. The data bits and the baseline parity bit may be written into memory 112 and made available for a later read out transaction request from master component 501B. Notably, however, the data bits may be simultaneously written into a buffer in memory 112, although such is not required for all embodiments of the solution.

The baseline parity generation module 515 may also provide the baseline parity bit value it generated to the Bit-flip identification ("BFI") module 520. Armed with the baseline parity bit value from the baseline parity generation module 515, the BFI module 520 may generate its own write-side parity bit from the data bits stored in the buffer. Comparing the write-side parity bit value to the baseline parity bit value, the BFI module 520 may determine if a parity bit error occurred in the data string of data bits on the write transaction. If it did, the BFI module 520 may generate an error output that halts the system 102 and triggers monitor module 114 to document conditions on the SoC at the time of detecting the write-side parity error. Because the monitor module 114 may be monitoring conditions such as power levels and temperatures and bandwidth availabilities and transaction request volumes and latencies associated with, but not limited to, master components 501, busses 505, memory 112, the monitor module 114 may document useful data for debugging SoC 102.

Because the BFI module 520 may determine when a parity error has occurred on the write-side of the memory 112, a read-side parity generation and comparison module 516 may be leveraged to identify parity errors that occur on the read-side of the memory 112. Notably, any parity error identified by the read-side parity generation and comparison module 516 must have occurred after the write transaction of the data string, otherwise the parity error would have been identified by the BFI module 520 at the time of writing the data string to the memory 112. In this way, a comparison of a read-side parity bit generated by the module 516 with the baseline parity bit generated by the module 515 may be used to identify a parity error event associated with the read transaction. Accordingly, the BFI module 520 may recognize the discrepancy between a read-side parity bit value and the baseline value and work with the monitor module 114 to document active conditions on the SoC 102 at the time of the read-side parity error occurrence. Similar to that which was described above, the BFI module 520 may cause a system halt of the SoC 102 in the event that a read-side parity bit value does not equate to the baseline parity bit value.

FIG. 5B is a functional block diagram illustrating an exemplary embodiment of an on-chip system for memory bit flip identification ("BFI") and power management solutions. The FIG. 5B diagram illustrates the relationship of the BFI module 520 shown in the FIG. 5A diagram to other components and modules residing on the SoC 102. During runtime, recognition of parity errors by the BFI module 520 may be used to optimize power supply levels and thermal policies for components on the SoC. As described above and below, the BFI module 520 may identify the occurrence of a bit flip and determine when and where the bit flip occurred. For instance, a BFI module 520 may determine in real time, or near real time, that a bit flip occurred somewhere along the write path or while the data was existing in memory 112. Further, a BFI module 520 may determine in real time, or near real time that a bit flip occurred somewhere along the read path and after the data existed uncorrupted in the memory 112. Armed with such knowledge, a BFI module 520 may work with a thermal and power policy manager module 101 to optimize power levels and thermal policies around the SoC 102 during runtime. In doing so, a bit flip occurrence rate may be effectively managed.

Referring back to the FIG. 5B illustration, monitor module 114 may continually monitor power levels and thermal energy levels associated with memory 112 and CPU 110, as indicated by the dashed lines leading from CPU 110 and memory 112 to monitor module 114. As one of ordinary skill in the art would recognize, CPU 110 may be a thermally aggressive component on the SoC 102, generating and dissipating thermal energy as it processes various workloads. Notably, the CPU 110 is referenced in the FIG. 5B illustration as a thermally aggressive component on SoC 102 with energy dissipation that affects nearby memory 112; however, it will be understood that CPU 110 is being offered for exemplary purposes and, in no way is a suggestion that CPU 110 is the only component residing on a SoC 102 that may adversely affect the bit flip rate of memory component 112.

As thoroughly described elsewhere in this specification, BFI module 520 may identify bit flip events associated with memory component 112. The rate of bit flip occurrences may be affected by power supply levels to the memory 112 and/or thermal energy generation and dissipation from nearby thermal aggressors (e.g., CPU 110). Consequently, upon recognition of a bit flip or bit flip occurrence rate, the BFI module 520 may work with a thermal and power policy manager 101 to adjust power to the memory 112 and/or CPU 110. To determine which power levels to adjust, and how much adjustment to make, the thermal power and policy manager module 101 may work with the monitor module 114 which may be actively monitoring power levels, temperature levels, workloads and the like. With the parameter levels monitored by the monitor module 114, the thermal and power policy manager module 101 may determine the appropriate power setting adjustments and coordinate with a dynamic voltage and frequency scaling ("DVFS") module to make the adjustments accordingly. Moreover, the manager module 101 may determine appropriate adjustments to temperature thresholds, workload levels, or the like to thermally aggressive components collocated on the SoC with the memory component and, in this way, effect a reduction in thermal energy generation by the thermally aggressive component.

In this way, a BFI module 520 may provide useful inputs to a thermal and power policy manager module 101 that enables the manager module 101 to make real-time, or near real time, adjustments that mitigate the future occurrence rate of unwanted bit flips. As one of ordinary skill in the art would recognize, an increase in power supply to a memory component 112 may combat operating conditions that cause bit flips while the decrease in power to nearby thermally aggressive components may favorably affect operating conditions (i.e., operating temperature) that contribute to bit flips.

Figure 6:
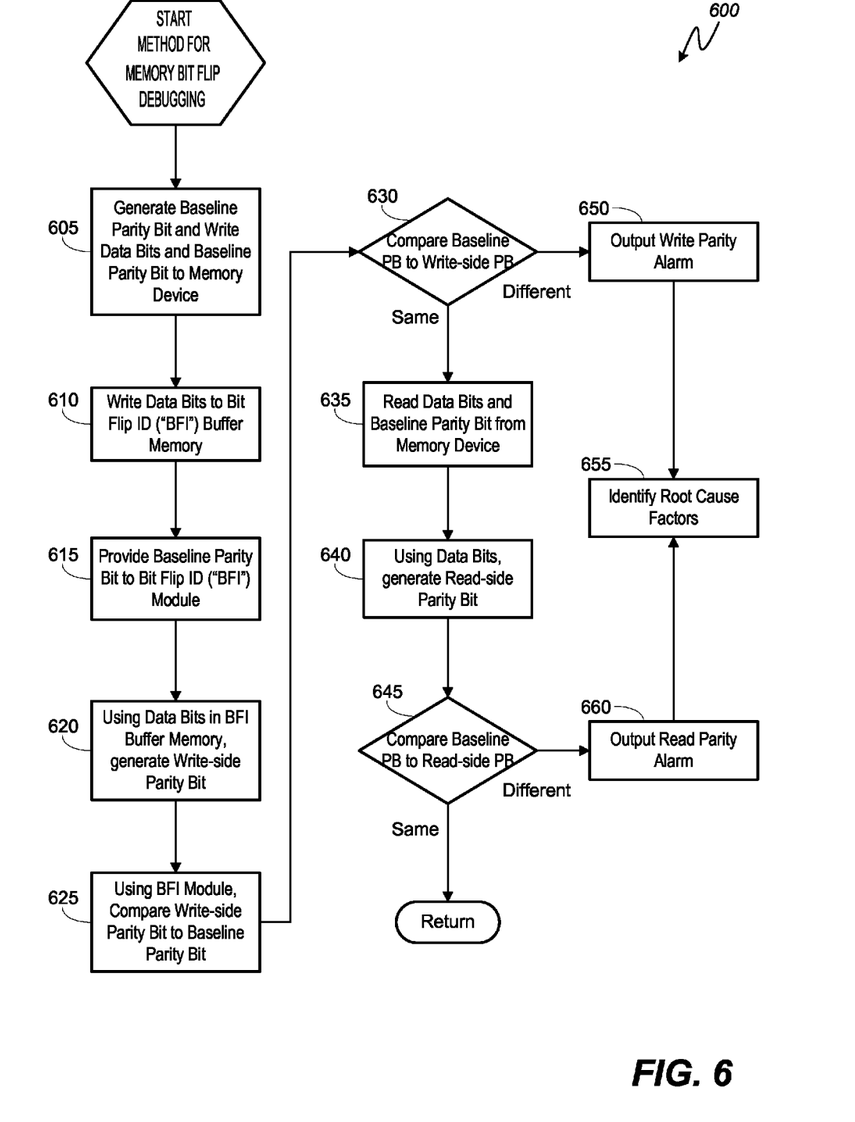
FIG. 6 is a logical flowchart illustrating an exemplary method for data corruption identification and memory bit flip debugging.

FIG. 6 is a logical flowchart illustrating an exemplary method for data corruption identification and memory bit flip debugging. Beginning at block 605, a baseline parity value may be generated and stored in a bit associated with a block of data bits. The block of data bits and the baseline parity bit may be stored in a memory device, such a bit cell array of an SRAM memory device or an ECC memory device. At block 610, the data bits are simultaneously written to a buffer. At this point, the data bits may be instantiated redundantly in the bit cell array and the buffer location.

At block 615, the baseline parity value may be provided to the BFI module. Next, at block 620 the BFI module may generate a write-side parity value from the data bits stored in the buffer (or the data bits stored in the bit cell array, depending on embodiment). At block 625, the BFI module may compare the write-side parity value it generated to the baseline parity value it was provided and compare them at decision block 630.

If the write-side parity value generated by the BFI module at block 625 is different from the baseline parity value provided to the BFI module at block 615, the data bits stored in the memory device are determined to contain at least one flipped bit, i.e. the data bit string is corrupted. In such case, the "different" branch is followed from decision block 630 to block 650 and a write parity alarm is outputted. The system may be halted. The method 600 continues to block 655 where root cause factors for the bit flips may be identified for troubleshooting and debugging efforts. Because conditions such as thermal energy exposure and low power supply levels may contribute to data corruption, monitoring such conditions and documenting their values at the time of an identified parity error occurrence may be helpful to designers seeking to debug a system.

Returning to decision block 630, if the write-side parity value generated by the BFI module at block 625 is the same as the baseline parity value provided to the BFI module at block 615, the data bits stored in the memory device are presumed valid and uncorrupted and the "same" branch is followed from decision block 630 to block 635. At block 635, the data bits may be read from the memory device along with the baseline parity bit and, at block 640, the data bits may be used to generate a read-side parity value.

At decision block 645, the read-side parity value may be compared to the baseline parity value and, if determined to be the same, the data bits are presumed valid and uncorrupted. If, however, the read-side parity value is different from the baseline parity value, then it may be determined that a bit flip error has occurred at some time subsequent to the previous comparison at decision block 630. That is, it may be determined that a read-side parity error has occurred. The "different" branch may be followed from decision block 645 to block 660 and a read parity alarm output. The system may be halted. The method 600 continues to block 655 where root cause factors for the bit flips may be identified for troubleshooting and debugging efforts. Because conditions such as thermal energy exposure and low power supply levels may contribute to data corruption, monitoring such conditions and documenting their values at the time of an identified parity error occurrence may be helpful to designers seeking to debug a system.

Figure 7:
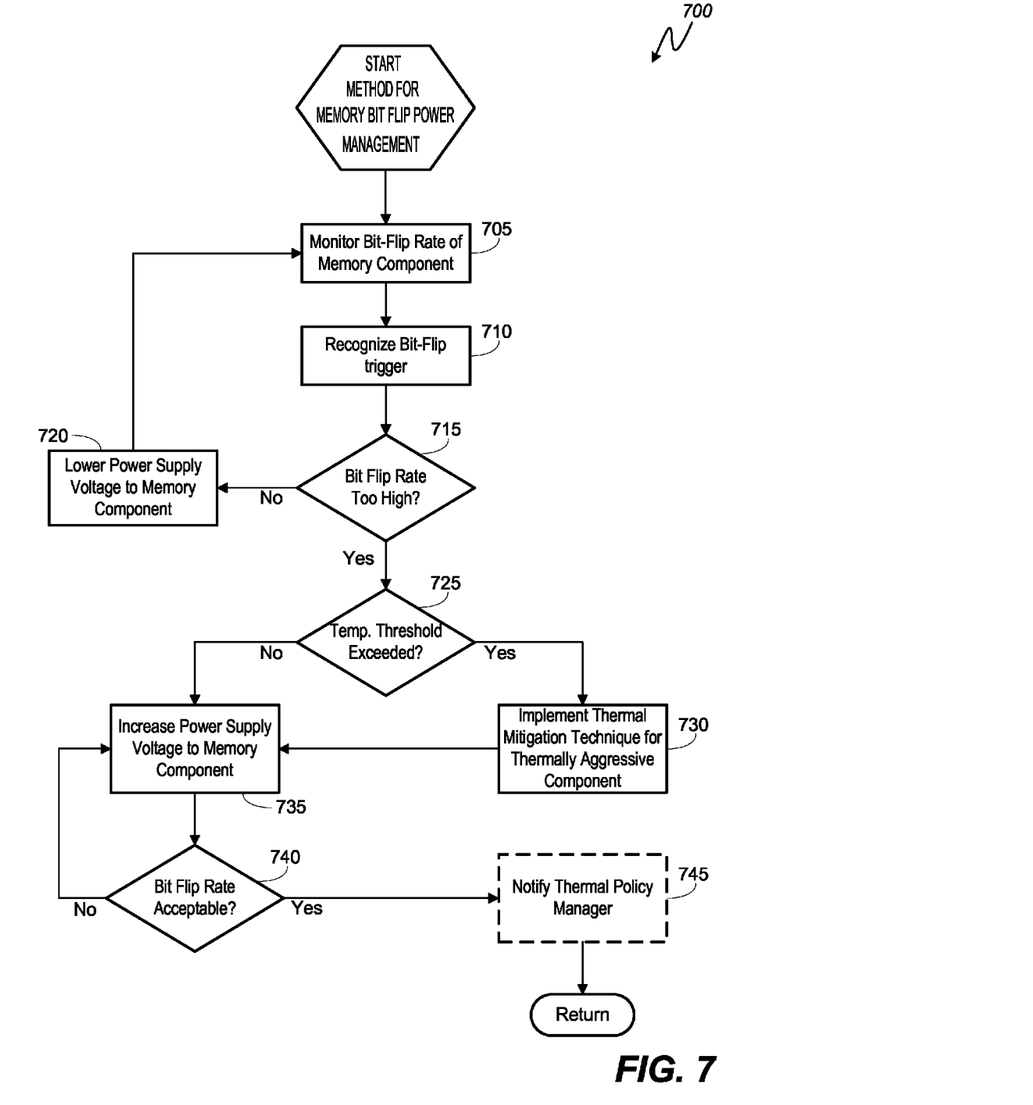
FIG. 7 is a logical flowchart illustrating an exemplary method for data corruption identification and power management in a system on a chip ("SoC").

FIG. 7 is a logical flowchart illustrating an exemplary method for data corruption identification and power management in a system on a chip ("SoC"). Beginning at block 705, a bit flip occurrence rate may be monitored by a BFI module and/or a monitor module. At block 710, the bit flip occurrence rate may be recognized as a trigger for making adjustments to a thermal policy and/or a power management policy. Because overly aggressive power reductions to a memory component, as well as overly aggressive processing speeds of thermally aggressive processing components, may contribute to bit flip occurrence, embodiments of the solution may use a bit flip occurrence rate as a trigger to adjust power supplies and/or thermal thresholds around the SoC. Advantageously, because BFI solutions described herein may be able to determine when and where a bit flip may have occurred in real time, or near real time, timely and optimal adjustments may be made to power supplies and thermal thresholds to maintain bit flip occurrence rates at acceptable levels without overly functionality of the SoC.

Returning to the method 700, at decision block 715 if the bit flip rate is below an acceptable level the "no" branch is followed to block 720. Because the bit flip rate is below an acceptable threshold, further power savings may be realized by reducing power to the memory component without risking data corruption. If, however, the bit flip rate is too high, i.e. the rate of data corruption exceeds an acceptable threshold, the method 700 follows the "yes" branch from decision block 715 to decision block 725.

At decision block 725, the method may determine if a temperature threshold associated with the memory component and/or an operating temperature associated with a nearby thermally aggressive component may be contributing to the unacceptable bit flip occurrence rate. If not, the method may deduce that the bit flip rate occurrence is due to a power supply level to the memory component being too low and the "no" branch is followed to block 735. At block 735, the power supply to the memory component may be increased, perhaps a bin setting at a time, until the bit flip rate at decision block 740 is acceptable.

Returning to decision block 725, if temperature levels associated with a thermally aggressive component are likely contributing to the bit flip rate occurrence in the memory component, the "yes" branch is followed to block 730 and thermal mitigation techniques may be applied or adjusted for the thermally aggressive component, thereby mitigating the dissipation of thermal energy that may be adversely affecting the bit flip occurrence rate. Simultaneously, the power supply to the memory component may be increased (block 735) to combat the ongoing exposure to thermal energy already generated and dissipated across the SoC. Once the bit flip rate is at an acceptable level, the "yes" branch is followed from decision block 740 and the method 700 returns. If the thermal policy of a thermally aggressive component was adjusted as a result of the bit flip rate, the method 700 may notify a thermal policy and power manager at block 745 that further reductions in thermal energy generation are not required.

Because conditions such as thermal energy exposure and low power supply levels may contribute to data corruption, monitoring such conditions and documenting their values at the time of an identified parity error occurrence may be useful inputs to a thermal energy and/or power management scheme. For instance, if bit flip occurrences are attributable to read transactions, adjustments to thermally aggressive components known to affect write-side transactions may be unnecessary. Similarly, if bit flip occurrences are attributable to write transactions, adjustments to thermally aggressive component known to affect the write-side transaction efficacy may be warranted. In these ways, embodiments of the solution that leverage parity bit error data captured by a BFI module may optimize thermal and power management policies and actions.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example. Therefore, disclosure of a particular set of program code instructions or detailed hardware devices or logic or software instruction and data structures is not considered necessary for an adequate understanding of how to make and use the invention. The inventive functionality of the claimed computer implemented processes is explained in more detail in the above description and in conjunction with the drawings, which may illustrate various process flows.

In one or more exemplary embodiments, the functions described may be implemented in hardware, software, firmware, or any combination thereof suitable therefor. If implemented in software, the functions may be stored on or transmitted as one or more instructions or code on a computer-readable device. Computer-readable devices include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Therefore, although selected aspects have been illustrated and described in detail, it will be understood that various substitutions and alterations may be made therein without departing from the spirit and scope of the present invention, as defined by the following claims.

What is claimed is:

1. A method for power management in a system on a chip ("SoC"), the method comprising:
   monitoring one or more parameters of the SoC that are associated with bit flips;
   calculating baseline parity values for data blocks of bits queued to be written to bit cell arrays of a random access memory (RAM) component and assigning the baseline parity values to parity bits uniquely associated with the data blocks;
   writing the data blocks to the bit cell arrays of the RAM component and a buffer of the RAM component;
   for each data block as it is written to the buffer, calculating a write-side parity value;
   for each data block, comparing its baseline parity value to its write-side parity value;
   for each data block, if the baseline parity value differs from the write-side parity value, recording the occurrence of a bit flip;
   based on determining that a rate of bit flip occurrences has exceeded a threshold, adjusting a thermal and power management policy associated with one or more thermally aggressive components of the SoC located in thermal proximity to the RAM component to reduce thermal energy generation by the one or more thermally aggressive components.

2. The method of claim 1, wherein adjusting the thermal and power management policy comprises modifying a temperature threshold associated with a thermally aggressive component.

3. The method of claim 1, wherein adjusting the thermal and power management policy comprises modifying a power supply level associated with a thermally aggressive component.

4. The method of claim 1, wherein adjusting the thermal and power management policy comprises modifying a workload level associated with a thermally aggressive component.

5. The method of claim 1, further comprising increasing a power supply level to the RAM component.

6. The method of claim 1, further comprising:
   determining that the rate of bit flip occurrences has dropped below the threshold; and
   based on determining that the rate of bit flip occurrences has dropped below the threshold, readjusting the thermal and power management policy.

7. The method of claim 6, wherein readjusting the thermal and power management policy comprises one or more of modifying a temperature threshold associated with a thermally aggressive component, modifying a power supply level associated with thermally aggressive component, modifying a workload level associated with the thermally aggressive component, and decreasing a power supply level to the RAM component.

8. The method of claim 1, wherein the RAM component comprises error correcting code ("ECC").

9. A method for power management in a system on a chip ("SoC"), the method comprising:
   monitoring one or more parameters of the SoC that are associated with bit flips;
   calculating baseline parity values for data blocks of bits queued to be written to bit cell arrays of a random access memory (RAM) component and assigning the baseline parity values to parity bits uniquely associated with the data blocks;

writing the data blocks to the bit cell arrays of the RAM component;

for each data block as it is written to the bit cell arrays, calculating a write-side parity value;

for each data block, comparing its baseline parity value to its write-side parity value;

for each data block, if the baseline parity value differs from the write-side parity value, recording the occurrence of a bit flip;

based on determining that a rate of bit flip occurrences has exceeded a threshold, adjusting a thermal and power management policy associated with one or more thermally aggressive components of the SoC located in thermal proximity to the RAM component to reduce thermal energy generation by the one or more thermally aggressive components.

10. The method of claim 9, wherein adjusting the thermal and power management policy comprises modifying a temperature threshold associated with a thermally aggressive component.

11. The method of claim 9, wherein adjusting the thermal and power management policy comprises modifying a power supply level associated with a thermally aggressive component.

12. The method of claim 9, wherein adjusting the thermal and power management policy comprises modifying a workload level associated with a thermally aggressive component.

13. The method of claim 9, further comprising increasing a power supply level to the RAM component.

14. The method of claim 9, further comprising:
determining that the rate of bit flip occurrences has dropped below the threshold; and
based on determining that the rate of bit flip occurrences has dropped below the threshold, readjusting the thermal and power management policy.

15. The method of claim 14, wherein readjusting the thermal and power management policy comprises one or more of modifying a temperature threshold associated with a thermally aggressive component, modifying a power supply level associated with a thermally aggressive component, modifying a workload level associated with a thermally aggressive component, and decreasing a power supply level to the RAM component.

16. The method of claim 9, wherein the RAM component comprises error correcting code ("ECC").

17. A system for power management in a system on a chip ("SoC"), the system comprising:
means for monitoring one or more parameters of the SoC that are associated with bit flips;
means for calculating baseline parity values for data blocks of bits queued to be written to bit cell arrays of a random access memory (RAM) component and assigning the baseline parity values to parity bits uniquely associated with the data blocks;
means for writing the data blocks to the bit cell arrays and a buffer of the RAM component;
for each data block as it is written to the buffer, means for calculating a write-side parity value;
for each data block, means for comparing its baseline parity value to its write-side parity value;
for each data block, if the baseline parity value differs from the write-side parity value, means for recording the occurrence of a bit flip;
based on determining that a rate of bit flip occurrences has exceeded a threshold, means for adjusting a thermal and power management policy associated with one or more thermally aggressive components of the SoC located in thermal proximity to the RAM component to reduce thermal energy generation by the one or more thermally aggressive components.

18. The system of claim 17, wherein the means for adjusting the thermal and power management policy comprises means for modifying a temperature threshold associated with a thermally aggressive component.

19. The system of claim 17, wherein the means for adjusting the thermal and power management policy comprises means for modifying a power supply level associated with a thermally aggressive component.

20. The system of claim 17, wherein the means for adjusting the thermal and power management policy comprises means for modifying a workload level associated with a thermally aggressive component.

21. The system of claim 17, further comprising means for increasing a power supply level to the RAM component.

22. The system of claim 17, further comprising:
means for determining that the rate of bit flip occurrences has dropped below the threshold; and
based on determining that the rate of bit flip occurrences has dropped below the threshold, means for readjusting the thermal and power management policy.

23. The system of claim 22, wherein the means for readjusting the thermal and power management policy comprises one or more of means for modifying a temperature threshold associated with a thermally aggressive component, means for modifying a power supply level associated with a thermally aggressive component, means for modifying a workload level associated with a thermally aggressive component, and means for decreasing a power supply level to the RAM component.

24. A system for power management in a system on a chip ("SoC"), the system comprising:
means for monitoring one or more parameters of the SoC that are associated with bit flips;
means for calculating baseline parity values for data blocks of bits queued to be written to bit cell arrays of a random access memory (RAM) component and assigning the baseline parity values to parity bits uniquely associated with the data blocks;
means for writing the data blocks to the bit cell arrays of the RAM component;
for each data block as it is written to the bit cell arrays, means for calculating a write-side parity value;
for each data block, means for comparing its baseline parity value to its write-side parity value;
for each data block, if the baseline parity value differs from the write-side parity value, means for recording the occurrence of a bit flip;
based on determining that a rate of bit flip occurrences has exceeded a threshold, means for adjusting a thermal and power management policy associated with one or more thermally aggressive components of the SoC located in thermal proximity to the RAM component to reduce thermal energy generation by the one or more thermally aggressive components.

25. The system of claim 24, wherein the means for adjusting the thermal and power management policy comprises means for modifying a temperature threshold associated with a thermally aggressive component.

26. The system of claim 24, wherein the means for adjusting the thermal and power management policy comprises means for modifying a power supply level associated with a thermally aggressive component.

27. The system of claim 24, wherein the means for adjusting the thermal and power management policy comprises means for modifying a workload level associated with a thermally aggressive component.

28. The system of claim 24, further comprising means for increasing a power supply level to the RAM component.

29. The system of claim 24, further comprising:
 means for determining that the rate of bit flip occurrences has dropped below the threshold; and
 based on determining that the rate of bit flip occurrences has dropped below the threshold, means for readjusting the thermal and power management policy.

30. The system of claim 29, wherein the means for readjusting the thermal and power management policy comprises one or more of means for modifying a temperature threshold associated with a thermally aggressive component, means for modifying a power supply level associated with a thermally aggressive component, means for modifying a workload level associated with a thermally aggressive component, and means for decreasing a power supply level to the RAM component.

\* \* \* \* \*